(12) United States Patent
Jang et al.

(10) Patent No.: US 9,564,899 B2
(45) Date of Patent: Feb. 7, 2017

(54) SIGNAL INPUT CIRCUIT AND OPERATING METHOD THEREOF

(71) Applicant: SK hynix Inc., Gyeonggi-do (KR)

(72) Inventors: Soo-Young Jang, Gyeonggi-do (KR); Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/727,429

(22) Filed: Jun. 1, 2015

(65) Prior Publication Data

US 2016/0164499 A1    Jun. 9, 2016

(30) Foreign Application Priority Data

Dec. 9, 2014   (KR) ........................ 10-2014-0175910

(51) Int. Cl.
  *H03K 7/08*    (2006.01)
  *H03K 19/0175*  (2006.01)
  *H03K 7/00*    (2006.01)

(52) U.S. Cl.
  CPC ........ *H03K 19/017509* (2013.01); *H03K 7/00* (2013.01); *H03K 7/08* (2013.01)

(58) Field of Classification Search
  CPC ..... H03K 19/017509; H03K 7/00; H03K 7/08

USPC ....................................................... 341/51, 53
See application file for complete search history.

(56) References Cited

U.S. PATENT DOCUMENTS

| | | | | |
|---|---|---|---|---|
| 6,642,503 B2 * | 11/2003 | Kummaraguntla | ....... | G01J 1/44 250/214 P |
| 7,653,165 B2 | 1/2010 | Casper et al. | | |
| 7,990,588 B2 * | 8/2011 | Tin | ........................ | H04N 1/6033 345/591 |
| 8,374,462 B2 * | 2/2013 | Jiang | .................... | G06K 9/4671 382/162 |
| 8,433,150 B2 * | 4/2013 | Yuan | ....................... | G06T 5/007 345/629 |

FOREIGN PATENT DOCUMENTS

KR    1020050078779    8/2005

* cited by examiner

*Primary Examiner* — Brian Young
(74) *Attorney, Agent, or Firm* — IP & T Group LLP

(57) ABSTRACT

An input circuit includes: an input buffering unit suitable for receiving one or more input data, wherein each toggling time is defined according to a value of each input data; and a data transformation unit suitable for transforming the input data into an output data according to a mapping table and the toggling time of the input data during a data input duration.

11 Claims, 4 Drawing Sheets

SIGNAL INPUT CIRCUIT AND OPERATING METHOD THEREOF

CROSS-REFERENCE TO RELATED APPLICATIONS

The present application claims priority of Korean Patent Application No. 10-2014-0175910, filed on Dec. 9, 2014, which is incorporated herein by reference in its entirety.

BACKGROUND

1. Field

Exemplary embodiments of the present invention relate to a semiconductor design technology and, more particularly, to a circuit for receiving a signal.

2. Description of the Related Art

Semiconductor devices such as double data rate synchronous DRAM (DDR SDRAM) receive signals including commands, addresses, and data from external controllers and perform various operations. Semiconductor devices have input circuits to receive these signals. Input circuits are classified into single ended circuits and differential circuits. Single ended circuits are advantageous because they have a simple structure, but are disadvantaged due to their vulnerability to inter symbol interference (ISI), cross talk, and noise. In contrast, the differential structure is advantageous because it is resistant to noise and can operate at high-speeds, but it is disadvantageous because of its complex structure, greater number of channels and greater power consumption. Therefore, design technologies have been developed to supplement these two structures. However, design technology for input circuit hardware has reached its limit.

In the present specification, a signal input circuit and operating method thereof providing a better signal transmission environment through data transformation will be described.

SUMMARY

Various embodiments are directed to an input circuit which transforms and uses an input signal.

In an embodiment, an input circuit may include: an input buffering unit suitable for receiving one or more input data, wherein each toggling time is defined according to a value of each input data; and a data transformation unit suitable for transforming the input data into an output data according to a mapping table and the toggling time of the input data during a data input duration.

The mapping table may include values of the output data, to which all possible values of each input data respectively correspond during a data input duration.

A dimension of the mapping table may correspond to a number of the input data.

The data transformation unit may include: a clock generation unit suitable for generating a counting clock signal corresponding to each toggling time of the input data during the data input duration; a counting unit suitable for generating a counting value based on the counting clock signal; and an output unit suitable for transforming the input data into the output data according to the mapping table and the counting value.

The input circuit may further include a strobe signal generation unit suitable for generating a strobe signal for defining the data input duration based on the input data.

In another embodiment, an operating method of an input circuit may include: providing a mapping table including values of output data, to which all of possible values of input data respectively correspond, during a data input duration; receiving the input data, wherein each toggling time is defined according to a value of each input data; and transforming the input data into the output data according to the mapping table and the toggling time of the input data during a data input duration.

A dimension of the mapping table may correspond to a number of the input data.

The mapping table may comprise a plurality of tables.

Each input data may have two values, a first one which represents a value of each input data, and a second one which indicates one of the plurality of tables.

The toggling time of each input data during the data input duration may comprise first and second toggling times, which are defined by the two values of each input data, respectively.

In an embodiment, an input circuit system may include: a controller suitable for generating input data of which a toggling time is defined according to a predetermined time value equal to or less than a maximum toggling time; and an input circuit suitable for forming a mapping table corresponding to the maximum toggling time, transforming the input data according to the mapping table, and outputting the transformed data.

The input circuit receives maximum time information corresponding to the maximum toggling time, and the number of coordinate components of the mapping table may correspond to the number of pieces of maximum time information.

The input circuit may include: a clock generation unit suitable for generating a counting clock signal corresponding to each toggling time of the input data during a data input duration; a counting unit suitable for generating a counting value based on the counting clock signal; and an output unit suitable for transforming the input data into the output data according to the mapping table and the counting value.

The input circuit may further comprise a strobe signal generation unit suitable for generating a strobe signal for defining the data input duration based on the input data.

DETAILED DESCRIPTION

Figure 1:
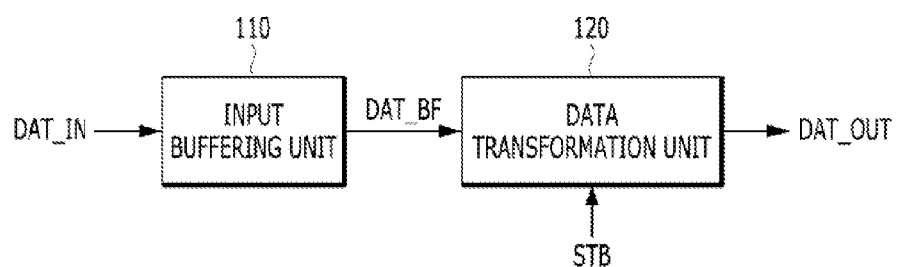
FIG. 1 is a block diagram illustrating an input circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an input circuit in accordance with an embodiment of the present invention.

Referring to FIG. 1, the input circuit may include an input buffering unit 110 and a data transformation unit 120.

The input buffering unit 110 may buffer input data DAT_IN and output the buffered input data DAT_IN as an output signal DAT_BF. A toggling time of the input data DAT_IN may be defined according to a value of the input data DAT_IN, which will be described in detail with reference to FIG. 2. For reference, the input buffering unit 110 may be the single-ended circuit or the differential circuit. FIG. 1 exemplarily shows the single-ended input buffering unit 100 of a single input signal and a single output signal.

The data transformation unit 120 may transform the output signal DAT_BF of the input buffering unit 110 according to a preset mapping table and the toggling time of the input data DAT_IN in response to a strobe signal STB, and then output the transformed signal as an output data DAT_OUT. The strobe signal STB may control an output time of the output data DAT_OUT of the data transformation unit 120. As described below in relation with the mapping table, the data transformation unit 120 can transform the output signal DAT_BF of the input buffering unit 110 into the output data DAT_OUT representing the input data DAT_IN according to the toggling time of the input data DAT_IN and the mapping table.

The input circuit in accordance with an embodiment of the present invention may transform the input data DAT_IN, the toggling time of which is defined according to the value of the input data DAT_IN, into the output data DAT_OUT representing the input data DAT_IN according to the toggling time of the input data DAT_IN and the mapping table. Such transformation may minimize the toggling number of the input data DAT_IN, which indicates a better signal transmission environment for the input circuit.

Figure 2:
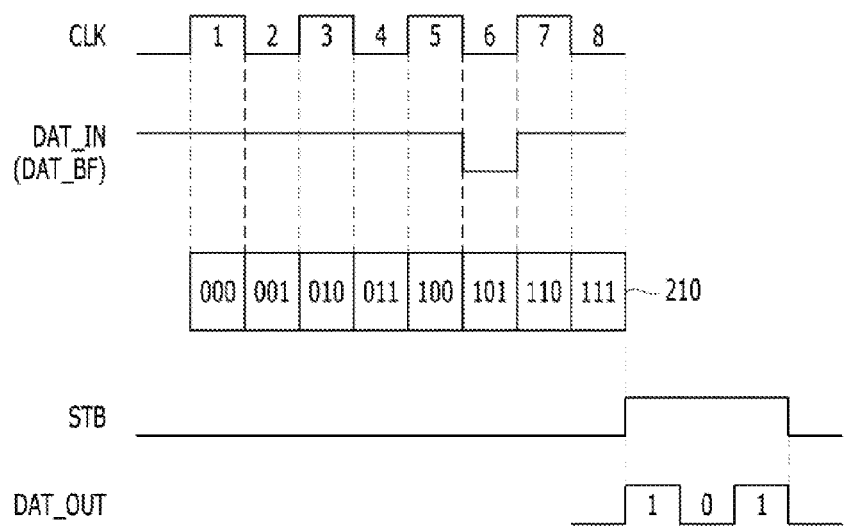
FIG. 2 is a timing diagram illustrating an operation of an input circuit shown in FIG. 1.

FIG. 2 is a timing diagram illustrating an operation of the input circuit shown in FIG. 1.

FIG. 2 illustrates a clock signal CLK, the input data DAT_IN, a mapping table 210, and output data DAT_OUT. The clock signal CLK may work in the input circuit. As an example, FIG. 2 exemplarily shows data input duration of 4 clocks or 8 toggles for the input data DAT_IN. The output signal DAT_BF and the input data DAT_IN may be the same signal. The mapping table 210 may be included in the data transformation unit 120, and may include logical data values. Such logical data values of the mapping table 210 may vary according to the design of the data transformation unit 120. A detailed embodiment thereof will be described in FIG. 3.

Hereinafter, the circuit operation of the input circuit will be described with reference to FIGS. 1 and 2. For convenience of description, suppose that the input data DAT_IN toggles at a time value of '6' corresponding to $6^{th}$ toggle of the clock signal CLK.

First, the input buffering unit 110 may buffer the input data DAT_IN toggling at the time value of '6' corresponding to $6^{th}$ toggle of the clock signal CLK. Then, the data transformation unit 120 may transform the buffered input data DAT_IN or the output signal DAT_BF into the output data DAT_OUT having a data value of '101' according to the mapping table 210 and the toggling time of the input data DAT_IN, and output the output data DAT_OUT, which thus represents the input data DAT_IN according to the toggling time of the input data DAT_IN and the mapping table, in response to a strobe signal STB, which is inputted at the end of the data input duration of 8 toggles for the input data DAT_IN.

As described above, the toggling number of the input data DAT_IN may be smaller than the toggling number of the output data DAT_IN. For example, the input data DAT_IN toggles once during the data input duration. This means that the input circuit can receive the input data DAT_IN in a better environment.

Figure 3:
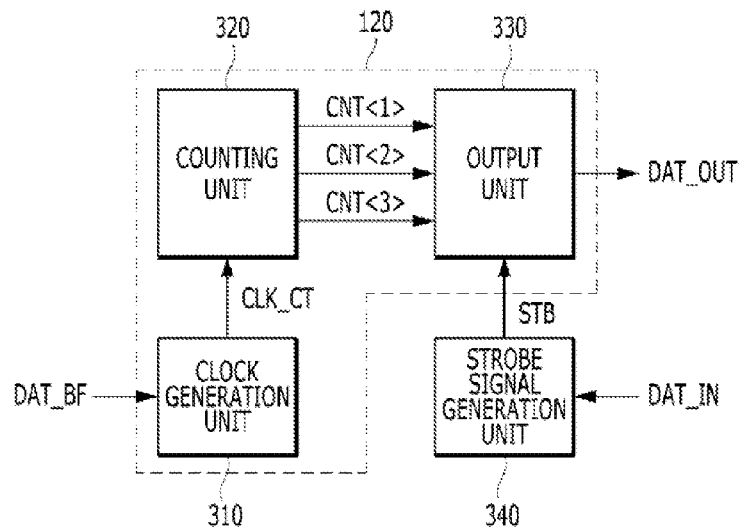
FIG. 3 is a block diagram illustrating a data transformation unit shown in FIG. 2.

FIG. 3 is a block diagram illustrating the data transformation unit shown 120 in FIG. 2. Referring to FIG. 3, the data transformation unit 120 may include a clock generation unit 310, a counting unit 320, and an output unit 330.

The clock generation unit 310 may generate a counting clock signal CLK_CT corresponding to the toggling time of the input data DAT_IN. For example, when the input data DAT_IN toggles at a time value of '6' corresponding to $6^{th}$ toggle of the clock signal CLK as illustrated in FIG. 2, the counting clock signal CLK_CT may toggle six times. The counting unit 320 may generate a counting value CNT<1:3> based on the counting clock signal CLK_CT. For example, when the counting clock signal CLK_CT toggles six times, the counting value CNT<1:3> may have a data value of '101' representing the number of toggles of the counting clock signal CLK_CT. The output unit 330 may output the counting value CNT<1:3> as the output data DAT_OUT in response to the strobe signal STB.

In the above-described configuration, it is possible to form the mapping table 210 into which the data values of FIG. 2 are reflected. The data values reflected into the mapping table 210 can be changed according to a circuit design. For example, when the initial value or increment of the counting unit 320 is used, more various data values can be reflected into the mapping table.

FIG. 2 illustrates that the strobe signal STB is activated at the end of the data input duration of 8 toggles of the clock signal CLK. However, the strobe signal STB may be activated when the input data DAT_IN toggles, which makes it possible to guarantee a faster input operation. FIG. 3 exemplarily shows a strobe signal generation unit 340 for controlling an activation time of the strobe signal STB in response to the toggling time of the input data DAT_IN. Such activation of the strobe signal STB in response to the toggling time of the input data DAT_IN means that an output time of the output unit 330 can be controlled in response to the toggling time of the input data DAT_IN. Therefore, when the strobe signal STB is activated in response to the input data DAT_IN, the input circuit can perform a faster input operation.

FIGS. 1 to 3 exemplarily show that the input circuit may receive a single input data DAT_IN. Hereinafter, an embodiment will be described in which the input circuit may receive two input data.

Figure 4:
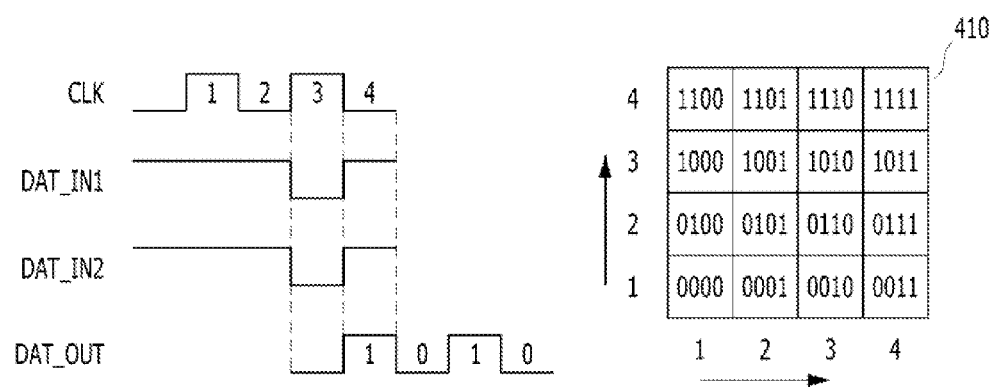
FIG. 4 is a timing diagram and a mapping table illustrating an operation of an input circuit in accordance with an embodiment of the present invention.

FIG. 4 is a timing diagram and a mapping table illustrating an operation of the input circuit in accordance with the embodiment of the present invention. FIG. 4 exemplarily shows the input circuit receiving first input data DAT_IN1 and second input data DAT_IN2, each of which toggles once according to a value thereof. As another embodiment, the input circuit may receive a single input data toggling a plurality of times according to a value thereof.

FIG. 4 shows an example of the mapping table 410 for the embodiment of the input circuit represented by FIG. 4. A value of the first input data DAT_IN1 may correspond to the column of the mapping table 420, and a value of the second input data DAT_IN2 may correspond to the row of the mapping table 420.

Referring to FIG. 4, the first and second input data DAT_IN1 and DAT_IN2 exemplarily toggles at a $3^{rd}$ toggle of the clock signal CLK according to their respective values. Therefore, the output data DAT_OUT may have a value '1010' of the $3^{rd}$ column and the $3^{rd}$ row of the mapping table 420, which correspond to the value of the first and second input data DAT_IN1 and DAT_IN2 represented by the toggle time (the $3^{rd}$ toggle of the clock signal CLK) of the first and second input data DAT_IN1 and DAT_IN2. The data input duration may be defined for each of the first and second input data DAT_IN1 and DAT_IN2. FIG. 4 exemplarily shows the data input duration of 3 toggles of the clock signal CLK for both the first and second input data DAT_IN1 and DAT_IN2.

As described above, the input circuit in accordance with the embodiment of the present invention may transform the first and second input data DAT_IN1 and DAT_IN2 into the output data DAT_OUT according to the mapping table 420 and the toggling time of the first and second input data DAT_IN1 and DAT_IN2.

Although FIG. 4 exemplarily shows the two-dimensional mapping table 420, the mapping table in accordance with the embodiment of the present invention may be higher-dimensional as the input data of the input circuit has more toggling times to be mapped to the value of the output data DAT_OUT by the mapping table.

Figure 5:
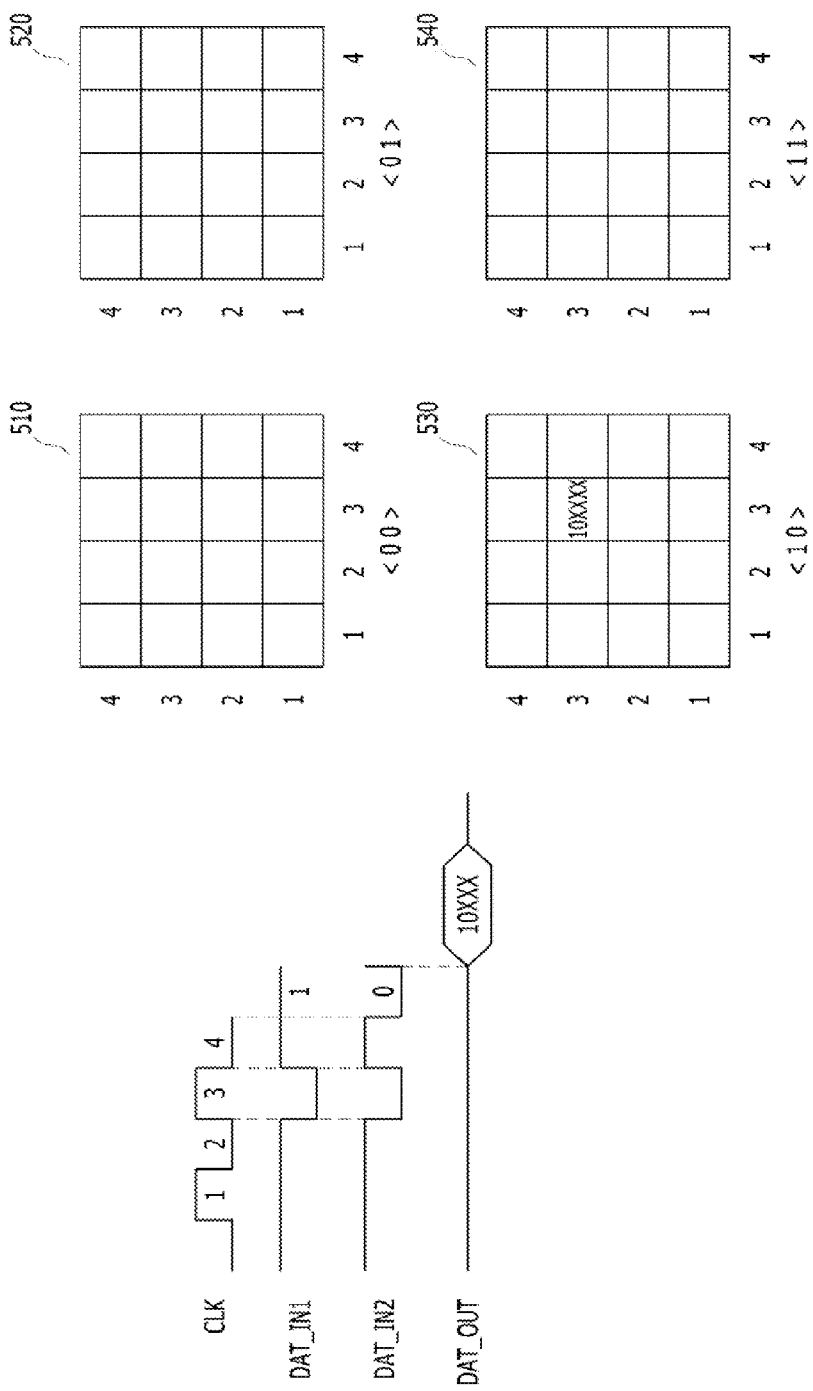
FIG. 5 is a timing diagram and a mapping table illustrating an operation of an input circuit in accordance with another embodiment of the present invention.

FIG. 5 is a timing diagram and a mapping table illustrating an operation of the input circuit in accordance with another embodiment of the present invention. FIG. 5 exemplarily shows the input circuit receiving first input data DAT_IN1 and second input data DAT_IN2, each of which toggles once according to a value thereof.

In accordance with an exemplary embodiment of the present invention, each of the first input data DAT_IN1 and the second input data DAT_IN2 in FIG. 4 has two values. A first one of the two values may represent a value of the corresponding input data, and a second one of the two values may indicate one of a plurality of mapping tables. In accordance with the embodiment of the present invention, the input circuit may have the plurality of mapping tables, i.e. first to fourth mapping tables 510 to 540 as exemplarily illustrated in FIG. 5, one of which is to be selected by the combined second values of the first and second input data DAT_IN1 and DAT_IN2. Each of the plurality of mapping tables 510 to 540 may have the same structure as the mapping table 410 described above with reference to FIG. 4. The first one of the two values may be represented by the toggling time of the first and second input data DAT_IN1 and DAT_IN2 during the data input durations for the first and second input data DAT_IN1 and DAT_IN2, respectively. The second one of the two values may be represented at the end of the data input durations for the first and second input data DAT_IN1 and DAT_IN2, respectively. The data input duration may be defined for each of the first and second input data DAT_IN1 and DAT_IN2. FIG. 5 exemplarily shows the data input duration of 5 toggles of the clock signal CLK for both of the first and second input data DAT_IN1 and DAT_IN2.

Referring to FIG. 5, the first input data DAT_IN1 exemplarily toggles at the $3^{rd}$ toggle of the clock signal CLK, which is the first one of the two values representing the value of the first input data DAT_IN1, and has a logic value of '1' at the end of the data input duration having a length of 5 toggles of the clock signal CLK for the first input data DAT_IN1, which is to be used for selecting one of the plurality of mapping tables 510 to 540. The second input data DAT_IN2 exemplarily toggles at the $3^{rd}$ toggle of the clock signal CLK, which is the first one of the two values representing the value of the second input data DAT_IN2, and has a logic value of 'O' at the end of the data input duration having a length of 5 toggles of the clock signal CLK for the second input data DAT_IN2, which is to be used for selecting one of the plurality of mapping tables 510 to 540. The combined second values (1, 0) may correspond to a third mapping table 530 among the first to fourth mapping tables 510 to 540, and the first values (3, 3) may correspond to a value of '10XXX' of the $3^{rd}$ column and $3^{rd}$ row of the third mapping table 530. The corresponding relationship between the combined second values and the plurality of mapping tables 510 to 540 may vary according to design.

As described above, the input circuit in accordance with an embodiment of the present invention may transform the first and second input data DAT_IN1 and DAT_IN2 into the output data DAT_OUT according to the plurality of mapping tables 510 to 540 and the toggling time of the first and second input data DAT_IN1 and DAT_IN2. Further, one of the plurality of mapping tables 510 to 540 may be selected by the combined second values of the first and second input data DAT_IN1 and DAT_IN2.

In accordance with an embodiment of the present invention, the input circuit may transform the input signals DAT_IN having a plurality of data values DAT_OUT into the output data through the mapping table.

Figure 6:
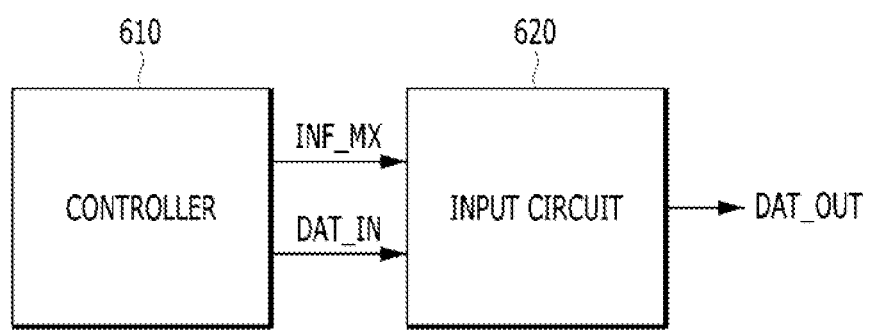
FIG. 6 is a block diagram illustrating an input circuit system in accordance with an embodiment of the present invention.

FIG. 6 is a block diagram illustrating an input circuit system in accordance with an embodiment of the present invention.

Referring to FIG. 6, the input circuit system may include a controller 610 and an input circuit 620. The input circuit 620 shown in FIG. 6 may be the same as the input circuit described above with reference to FIGS. 1 to 5.

The controller 610 generates input data DAT_IN of which a toggling time is defined according to a predetermined time value. At this time, the input data DAT-IN is a signal of which a toggling time is defined according to a predetermined time value before a maximum toggling time, and the controller 610 generates maximum time information INF_MX corresponding to the maximum toggling time and provides the generated information to the input circuit 620. The maximum time information INF_MX, that is, the maximum toggling time may indicate the maximum time at which the input data DAT_IN can toggle on the basis of unit data thereof. For example, in FIG. 2, the unit data of the input data DAT_IN can toggle at the maximum time value of '8'. Thus, the maximum time information INF_MX may correspond to the time value of '8'.

The input circuit 620 forms a mapping table according to the maximum time information INF_MX, transforms the input data DAT_IN according to the mapping table, and outputs the transformed data. As described above, the maximum time information indicates the maximum toggling time. Thus, the mapping table is formed according to the maximum toggling time, which means that the mapping table can be defined to have data values corresponding to all toggling times of the input data DAT_IN. Furthermore, the number of pieces of maximum time information INF-MX may correspond to the number of coordinate components of the mapping table. For example, when there are two pieces of maximum time information INF_MX, it is possible to form a mapping table having two coordinate components.

Hereinafter, a simple circuit operation will be described. For convenience of description, a case in which the input circuit 620 of FIG. 6 forms the mapping table 210 illustrated in FIG. 2 will be taken as an example.

First, the controller 610 provides information of '8' and information of '1' corresponding to the horizontal axis and the vertical axis of the mapping table 210 in FIG. 2 to the input circuit 620 through the maximum time information INF-MX. Subsequently, the input circuit 620 forms the mapping table as illustrated in FIG. 2 in response to the maximum time information INF_IN. After the mapping table is formed, the input circuit 620 may receive the input data DAT_IN and transform the received data according to the mapping table 210.

The input circuit system in accordance with the embodiment of the present invention can form a mapping table corresponding to the input data DAT_IN generated from the controller 610, thereby improving a signal transmission environment between the controller 610 and the input circuit 620.

As described above, the input circuit in accordance with the embodiment of the present invention can transform the input data DAT_IN of which a toggling time is defined according to a preset time value, according to the mapping table. Such a circuit configuration and circuit operation can provide a better signal transmission environment.

Therefore, it is possible to improve the signal transmission environment.

Although various embodiments have been described for illustrative purposes, it will be apparent to those skilled in the art that various changes and modifications may be made without departing from the spirit and scope of the invention as defined in the following claims.

What is claimed is:

1. An input circuit comprising:
    an input buffering unit suitable for receiving one or more input data, wherein each toggling time is defined according to a value of each input data; and
    a data transformation unit suitable for transforming the input data into an output data according to a mapping table and the toggling time of the input data during a data input duration,
    wherein the mapping table includes values of the output data, to which all possible values of each input data respectively correspond during a data input duration.

2. The input circuit of claim 1, wherein a dimension of the mapping table corresponds to a number of the input data.

3. The input circuit of claim 1, wherein the data transformation unit comprises:
    a clock generation unit suitable for generating a counting clock signal corresponding to each toggling time of the input data during the data input duration;
    a counting unit suitable for generating a counting value based on the counting clock signal; and
    an output unit suitable for transforming the input data into the output data according to the mapping table and the counting value.

4. The input circuit of claim 1, further comprising a strobe signal generation unit suitable for generating a strobe signal for defining the data input duration based on the input data.

5. An operating method of an input circuit, comprising:
    providing a mapping table including values of output data, to which all of possible values of input data respectively correspond, during a data input duration;
    receiving the input data, wherein each toggling time is defined according to a value of each input data; and
    transforming the input data into the output data according to the mapping table and the toggling time of the input data during a data input duration wherein the mapping table comprises a plurality of tables.

6. The operating method of claim 5, wherein a dimension of the mapping table corresponds to a number of the input data.

7. The operating method of claim 5, wherein each input data has two values, a first one which represents a value of each input data, and a second one which indicates one of the plurality of tables.

8. The operating method of claim 7, wherein the toggling time of each input data during the data input duration comprises first and second toggling times, which are defined by the two values of each input data, respectively.

9. An input circuit system comprising:
    a controller suitable for generating input data of which a toggling time is defined according to a predetermined time value equal to or less than a maximum toggling time; and
    an input circuit suitable for forming a mapping table corresponding to the maximum toggling time, transforming the input data according to the mapping table, and outputting the transformed data,
    wherein the input circuit comprises:
        a clock generation unit suitable for generating a counting clock signal corresponding to each toggling time of the input data during a data input duration;
        a counting unit suitable for generating a counting value based on the counting clock signal; and
        an output unit suitable for transforming the input data into the output data according to the mapping table and the counting value.

10. The input circuit system of claim 9, wherein the input circuit receives maximum time information corresponding to the maximum toggling time, and
    the number of coordinate components of the mapping table corresponds to the number of pieces of maximum time information.

11. The input circuit of claim 9, wherein the input circuit further comprises a strobe signal generation unit suitable for generating a strobe signal for defining the data input duration based on the input data.

\* \* \* \* \*